United States Patent [19]

Tarui et al.

[11] 3,766,446

[45] Oct. 16, 1973

[54] INTEGRATED CIRCUITS COMPRISING LATERAL TRANSISTORS AND PROCESS FOR FABRICATION THEREOF

[75] Inventors: Tasudo Tarui; Yoshio Komiya, both of Tokyo, Japan

[73] Assignee: Kogyo Gijutsuin, Tokyo, Japan

[22] Filed: Nov. 18, 1970

[21] Appl. No.: 90,672

[30] Foreign Application Priority Data

Nov. 20, 1969 Japan ................................ 44/92513
Nov. 26, 1969 Japan ................................ 44/94335

[52] U.S. Cl....... 317/235 R, 317/235 D, 317/235 G, 317/235 Y, 317/235 AN, 148/1.5

[51] Int. Cl. .............................................. H01l 19/00

[58] Field of Search ..................... 317/235 Y, 235 E, 317/235 AM, 235 AN, 235

[56] References Cited

UNITED STATES PATENTS

| | | | |
|---|---|---|---|
| 3,427,513 | 2/1969 | Hilbiber | 317/235 |
| 3,502,951 | 3/1970 | Hunts | 317/235 |
| 3,576,475 | 4/1971 | Kvonlage | 317/235 |
| 3,390,025 | 6/1968 | Strieter | 317/235 |
| 3,454,846 | 7/1969 | Haenichen | 317/235 |
| 3,456,168 | 7/1969 | Tatom | 317/235 |
| 3,548,269 | 12/1970 | MacDougall et al. | 317/235 |

FOREIGN PATENTS OR APPLICATIONS

| | | | |
|---|---|---|---|
| 466,872 | 2/1969 | Switzerland | 317/235 |

OTHER PUBLICATIONS

IBM Tech. Discl. Bul., "Manufacture of Semiconductor Devices by Ion Bombardment" by Gardner et al., Vol. 11, No. 5, Oct. 68, page 562.

*Primary Examiner*—Jerry D. Craig
*Attorney*—Robert E. Burns and Emmanuel J. Lobato

[57] ABSTRACT

A "lateral" transistor for use in integrated circuits may have its base region formed by a technique of "ion implantation" with or without a step of impurity diffusion or, alternatively, by two steps of impurity diffusion including the formation of the so-called "buried" layer. In either case an emitter region is double-diffused into the base region simultaneously with collector diffusion, in such a manner that the base width of the lateral transistor is defined by a difference between the lengths of the double diffusion. The aforesaid ion implantation and buried layer techniques are utilized in the fabrication of integrated circuits incorporating such lateral transistors, in which base regions and isolation regions are formed at the same time. In other integrated circuits also disclosed herein, the lateral transistors together with or without field-effect transistors are isolated by means of substrate having higher resistivity than the base regions of the transistors.

7 Claims, 33 Drawing Figures

INTEGRATED CIRCUITS COMPRISING LATERAL TRANSISTORS AND PROCESS FOR FABRICATION THEREOF

BACKGROUND OF THE INVENTION

This invention relates to integrated circuits, and more particularly to integrated circuits comprising new and better transistors with their primary working regions in lateral arrangement (hereinafter referred to as "lateral transistors") which are designed for optimum use in integrated circuits and which are operable at high frequencies and at extremely high switching speeds. The invention is also directed to a process for the fabrication of such integrated circuits.

A considerable part of the innovations in transistor design introduced over the years from the invention of a transistor itself to the advent of a mesa transistor had been aimed at improvement of the frequency characteristics of the transistors through reduction of the width of their base region. As this base width was then placed under sufficient control by advancements in the technology of impurity diffusion, renewed efforts have been expended in the transistor technology to control their maximum frequency of oscillation (which is a very important figure of merit of transistors to be considered in evaluation of their overall high frequency characteristics) by another factor, that is, the base resistance.

In so far as the present applicant is aware, however, no prior art transistor has made a true success in the reduction of both the base resistance and the aforesaid base width because this dual objective is self-contradictory, as explained later in greater detail with reference to the accompanying drawings showing some of the prior art in relation with the present invention.

SUMMARY OF THE INVENTION

It is thus a primary object of the present invention to provide an integrated circuit, and a process for the fabrication thereof, comprising a lateral transistor or transistors in accordance with the invention in which is accomplished the conventionally unattained dual objective of reduction of both their base width and base resistance.

Another object of the invention is to provide a lateral transistor for operation at high frequencies, and a process for the fabrication thereof, in which the width of an active base portion is determined by a difference between the lengths of the diffusions of impurity materials of opposite conductivity types (i.e. base diffusion and emitter diffusion) and in which the length of an internal base resistance portion in the direction of base current flow is determined by the depth of emitter diffusion, so that a base width on the order of several tenths of one micron is materialized.

Still another object of the invention is to provide a process for the fabrication of a lateral transistor for optimum use in an integrated circuit at high switching speeds, in which the dual objective of reduction of both the base width and internal base resistance is accomplished by its base region with or without an $n^+$-type "buried" base layer by a technique of "ion implantation" or diffusion effected through one and the same opening etched in a diffusion mask as emitter diffusion.

Yet another object of the invention is to provide a lateral transistor for optimum use in an integrated circuit, having such a constant base width that it is not likely to be affected by the undesirable phenomena known as the base-width modulation effect (or the Early effect), nor is there hardly any possibility of the base suffering the so-called punch-through, even though its width is as short as several tenths of one micron.

A further object of the invention is to provide an integrated circuit with superior performance charcteristics, in which a plurality of transistors including the lateral transistors of the invention are formed in isolation and in a highly compacted state.

All these, as well as the other objects hereinafter set forth, are accomplished by the present invention, which will become clearer and more understandable from the following detailed description made with reference to the accompanying drawings.

BRIEF DESCRIPTION OF THE DRAWINGS

In the drawings:

FIG. 7(*b*) is a graph in which is plotted the concentration of impurities as a function of distance $x$ toward a substrate, the concaved impurity profile here being indicated by the impurities diffused from above and below an epitaxial layer to form the base and isolation regions of an integrated transistor;

DETAILED DESCRIPTION OF THE INVENTION

As is clear from this expression, the maximum frequency of oscillation of a transistor is the reciprocal of the emitter width *S*. Heretofore this emitter width S has been determined by the photoetching technique, with an accuracy well over ten times inferior than that of the diffusion technique. The emitter width so determined will be 1 micron at best and, moreover, the emitter width of this value cannot be obtained efficiently by the photoetching technique. If, therefore, the length of a base resistance portion in the direction of base current flow (corresponding to the aforesaid emitter width) is controlled with the accuracy of the diffusion technique, and at the same time if the base resistance is made sufficiently small, the frequency characteristics of the transistor are certain to make drastic improvement.

Figure 1:
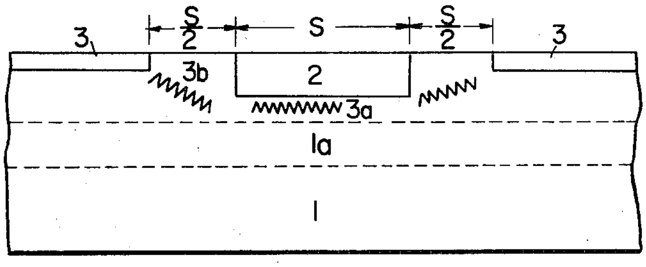
FIG. 1 PRIOR ART
FIG. 1 is a schematic diagram given by way of explanation of a prior planar "vertical" transistor.
Figure 2:
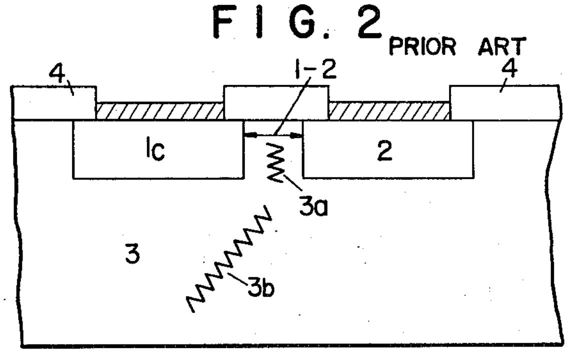
FIG. 2 PRIOR ART
FIG. 2 is a schematic diagram given by way of explanation of a prior lateral transistor.

In a conventionally available lateral transistor illustrated schematically in FIG. 2, on the other hand, a collector region 1c and an emitter region 2 are positioned by the diffusion of impurities through different openings of a mask. Hence the width of a base portion 1–2 between the collector region 1*c* and emitter region 2, determined also by the photoetching technique, is approximately 1 micron at the shortest, no smaller base width having been obtainable heretofore. The result is that the lateral transistor of prior design has not been put to satisfactory use at high frequencies, though its internal base resistance portion 3*a* can be rendered considerably small.

Now, according to the lateral transistors for integrated circuits in accordance with the present invention, the length(S) of a portion therein corresponding to the aforesaid internal base resistance portion is determined by the length of emitter diffusion, whereas their base width is determined by a difference between the lengths of double diffusion (consisting of base diffusion and emitter diffusion) made through one and the same opening, so that the effects of the poor accuracy of the photoetching technique are substantially foreign to the lateral transistors of the invention. These features of the invention, plus the provision of a $p^+$- or $n^+$-type base portion into which there is hardly any injection of minority carriers, make possible the accomplishment of the dual objective (hitherto considered unattainable because of its self-contradictory nature) of the reduction of both the base width and base resistance of the transistor.

Figure 3:
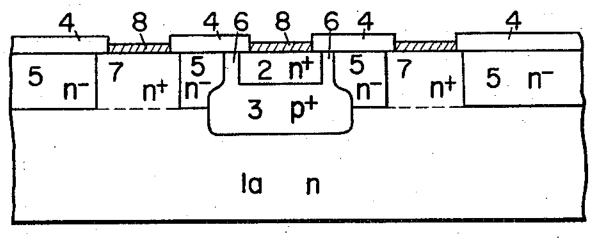
FIG. 3 is a schematic diagram of a cross section of a lateral transistor for optimum use in an integrated circuit, fabricated by the ion implantation technique in accordance with the present invention.
Figure 4A:
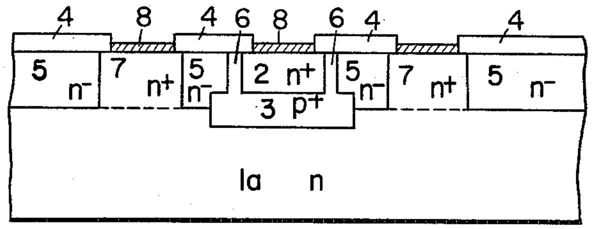
FIGS. 4(*a*) and (*b*) are schematic diagrams of cross sections of lateral transistors for optimum use in integrated cicuits in accordance with the present invention, the lateral transistors here having previously "buried" base layers.
Figure 4B:
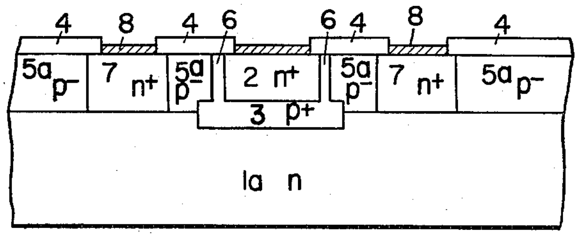

The lateral transistors for optimum use in integrated circuits in accordance with the present invention may be broadly classified into those illustrated in FIGS. 3 and 4, FIG. 3 showing a lateral transistor whose base impurities are introduced by the technique of ion implantation alone or in combination with that of diffusion, and FIGS. 4(*a*) and (*b*) showing transistors which have buried base layers for the reduction of the base resistance. (Steps involved in the aforesaid ion implantation process will be described later in greater detail, when description is to be given on the process of fabrication of the lateral transistor of FIG. 3 in an integrated circuit.)

To give a brief description on the configuration of the lateral transistor of FIG. 3, the reference character 1a in the drawing indicates an n-type substrate; 2 indicates an $n^+$-type emitter; 3 indicates a $p^+$-type base region fabricated by the ion implantation technique (this base region serves for the desired reduction of the base resistance since it is caused to contain a peak concentration of the impurities introduced by the ion implantation technique); 4 indicates a mask for selective diffusion of the impurities; and 5 indicates an $n^-$-type epitaxial layer. Further an active base portion 6 in the lateral direction, in which the minority-carrier injection from the emitter region 2 mostly takes place, is formed as a difference, as it were, between the length of the p-type diffusion (which may be carried out by the ion implantation technique alone or in combination with the diffusion technique including heat treatment) and the length of the $n^+$-type emitter diffusion. Windows for the diffusion of the emitter region 2 and the $n^+$-type collector 7 may be opened by the photoetching technique according to the prior self-aligning method, and during the process of the ion implantation into the base region 3 the collector region 7 may be shielded by means of a vacuum evaportated metallic mask of adequate layout. Upon introduction of the base impurities by the ion implantation process with or without a step of diffusion, the metal mask is removed and the $n^+$-type impurities are diffused through the windows of the mask 4 for the simultaneous formation of the emitter region 2 and the collector region 7. The reference numeral 8 indicates aluminum metalization effected for contact of the emitter and collector regions with external leads.

There will now be described the steps of fabrication of the lateral transistor having the buried base layer of, for example, FIG. 4(*a*) with reference to FIG. 5.

A $p^+$-type layer 3, to become part of a base region, is firstly formed by selective diffusion in an $n^+$-type substrate 1a, as in FIG. 5(*a*). Then, as in FIG. 5(*b*), an n-type epitaxial layer 5 is made to grow over the whole exposed surfaces of the substrate 1*a* and the layer 3. Although this $p^+$-type layer 3 may slightly increase in thickness in this instance, the epitaxial growth of the layer 5 is carried out until the layer 3 is buried completely therebelow. A p-type portion 6 is succeedingly diffused to the depth of the $p^+$-type layer 3 through a window opened in a diffusion mask 4 (e.g. a film of a suitable oxide) by the photoetching technique, as in FIG. 5(*c*). With this window left as it is, another window is similarly etched upon through the diffusion mask 4 above a collector region 7 to be formed succeedingly, and $n^+$-type impurities are diffused through these openings for the simultaneous formation of an emitter region 2 and the collector region 7(or a low-resistance portion of the overall collector region including the n-type substrate 1*a* and the $n^-$-type epitaxial layer 5), as in FIG. 5(*d*). As a final step, contacts 8 are formed as in FIG. 5 (*e*) by the process of the vacuum evaporation of metallic material in combination with the photoetching technique. Hence a lateral transistor of an $n^+pn^-n^+$ configuration in accordance with the present invention is completed.

According to this configuration, impurity concentration can be made higher in the active p-type base portion 6, in which minority-carrier injection from the emitter region 2 mostly takes place, on top of the buried base layer 3 than in the $n^-$-type epitaxial layer 5 of the overall collector region, so that the depletion region of this transistor will primarily lie toward the collector portion. The possibility of the aforementioned base-width modulation effect is thus substantially reduced and, at the same time, the punch-through of the collector portion 7 to the emitter region 2 due to a DC bias is successfully prevented. Further the base region surrounding the emitter region 2 is constituted of the portion 6 (defined by a difference between the lengths of the base diffusion and the emitter diffusion) and the buried $p^+$-type layer 3, the minority-carrier injection from the emitter region 2 being caused mostly in the former due to a difference between the impurity concentrations thereof. As described above, this active base portion 6 is formed by the double diffusion effected through one and the same etched window, so that, as in the prior art planar transistors, the width of the base portion 6 is defined by a difference between the lengths of the diffusions of the two impurity materials. Further in this case, the aforementioned lengths ($S$) of the internal base resistance portion in the direction of base current flow is defined by the depth of the emitter diffusion. As a result, the base width of the transistor can easily be reduced to less than 0.5 micron, which makes possible the fabrication of the transistor whose $f_T$ is on the order of several gigahertz. The $p^+$-type buried base layer 3, into which there are hardly any minority carriers injected because of its high impurity concentration, serves for greatly reducing the base resistance as it is in contact with the active base portion 6. The resistance of this buried $p^+$-type layer corresponds to the aforementioned external base resistance of the prior art transistors, and since this layer can be sufficiently increased in both its impurity concentration and physical thickness without regard to the rest of the lateral transistor configuration, it will be seen that the external base resistance can be reduced as dictated by the desired application of the transistor.

The provision of a $p^-$-type epitaxial layer, instead of the $n^-$-type one used above, in the foregoing fabrication sequence will make possible the formation of the lateral transistor of an $n^+pp^-n^+$ configuration shown in FIG. 4(*b*). In this case the $p^-$-type epitaxial layer 5a will form a collector depletion region, so that the base width of this lateral transistor is to be taken at the base portion 6 as in the lateral transistor of FIG. 4(*a*), which is defined by a difference between the lengths of the base diffusion and the emitter diffusion. Also as in the lateral transistor of FIG. 4(*a*), the internal base resistance of this latter transistor is controllable by the depth of the emitter diffusion, so that this $n^+pp^-n^+$ transistor of FIG. 4(*b*), too, may be suitable for use at high frequencies. $n^+$ As may be seen from the foregoing, the lateral transistors for optimum use in integrated circuit in accordance with the present invention successfully accomplish the dual objective of reduction of both the base width and the internal base resistance by the process of the double diffusion, as well as by the provision of the active base portion fabricated by the ion implantation technique or of the $b^+$-type buried base layer fabricated by the diffusion technique. The lateral transistors of the invention will thus be admirably suited for applications where high switching speeds are anticipated.

Figure 6A:
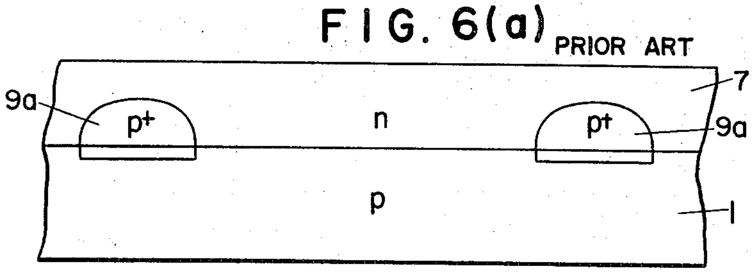
FIG. 6(a) PRIOR ART
FIGS. 6(*a*) and (*b*) are schematic diagrams given by way of explanation of an isolation technique of a prior planar "vertical" transistor in an integrated circuit.
Figure 6B:
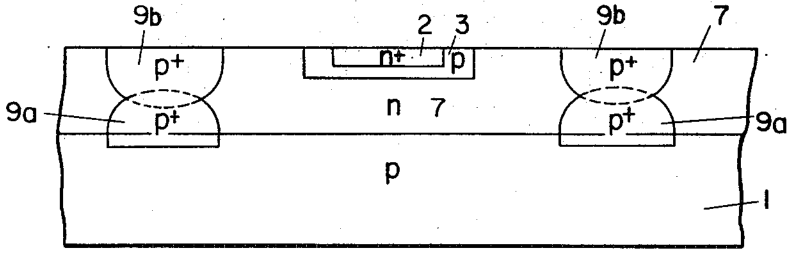
FIG. 6(b) PRIOR ART
Figure 5A:
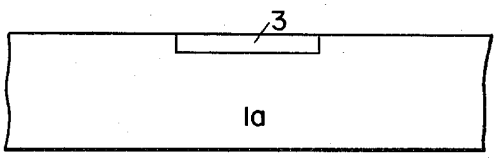
FIGS. 5(*a*) through (*e*) are schematic diagrams showing in sequence the steps of fabrication of the lateral transistor of FIG. 4(*a*)
Figure 5B:
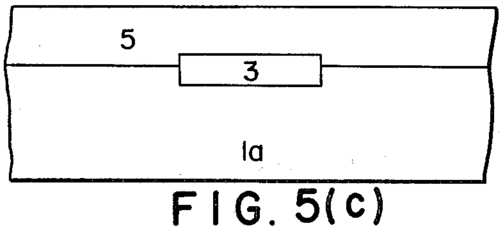
Figure 5C:
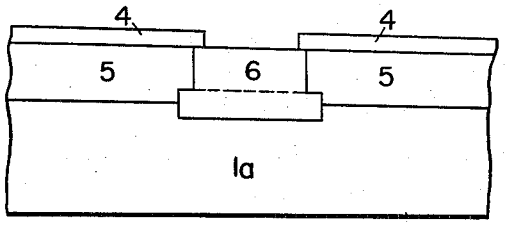
Figure 5D:
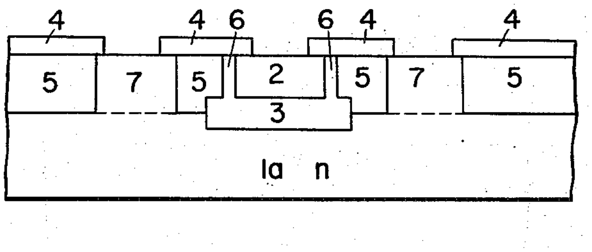
Figure 5E:
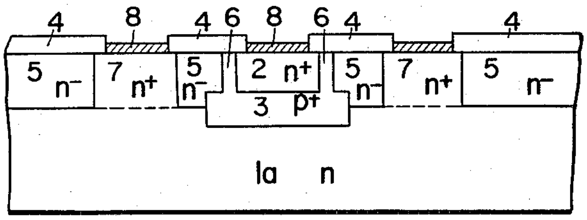

Description will now be given on the isolation techniques employed in the fabrication of integrated circuits in accordance with the present invention, in which are used the above described lateral transistors. For clarification of the advantages of the isolation techniques of the invention, a conventional counterpart as employed for the fabrication of an integrated circuit comprising the prior planar "vertical" transistor will first be briefly explained with reference to FIGS. 6(*a*) and (*b*) by way of comparison. As seen in FIG. 6(*a*), $p^+$-type regions 9a are formed by selective diffusion in a $p^+$-type substrate 1, and an $n$-type epitaxial layer 7 is formed thereupon. Succeedingly $p^+$-type isolation regions 9b are formed also by selective diffusion in the $n$-type epitaxial layer 7 through windows etched open in an adequate diffusion mask. A base region 3 is then formed also by selective diffusion through another window opened therein, and an emitter region 2 is double-diffused into the base region 3. What should be noted in this prior isolation technique is that the diffusion depths of the isolation regions 9b and the base region 3 have to be at variance for the satisfactory performance of the transistor, that is, the former being diffused deeper than the latter. Hence the isolation diffusion and the base diffusion have to be effected through windows that have to be opened by different photoetching operations, and the aforesaid selective diffusions too have to be carried out under different sets of conditions.

In contrast, according to one isolation technique employed for the fabrication of an integrated circuit of the above described lateral transistors of the invention, the introduction of impurities into isolation regions and that into base regions can be carried out by the use of one and the same mask, while emitter regions are formed by the double diffusion technique through the same windows as those for the base regions, so that no additional step of re-alignment is required. Further an epitaxial layer can be made of approximately the same depth as the base regions because of the exclusive transistor configurations of the present invention. For all these reason, the lateral transistors can be formed in isolation in a highly compacted state for the provision of high-performance integrated circuits.

Figure 7A:
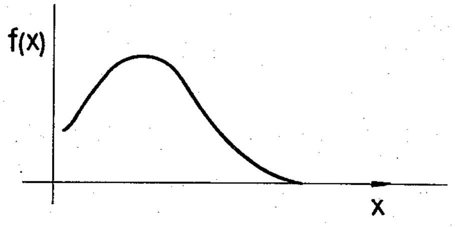
FIG. 7(*a*) is a graph in which is plotted the concentration of impurities as a function of distance $x$ toward a substrate, the convexed impurity profile here being indicated by the impurities introduced into the base and isolation regions of an integrated transistor by the ion implantation technique.
Figure 7B:
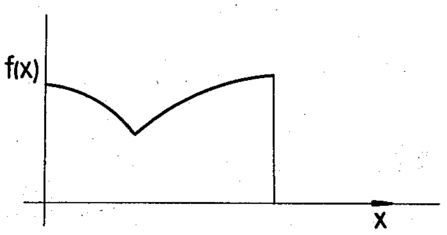

In the transistors fabricated in an integrated circuit, the impurity profile exhibited commonly in the isolation regions and base regions when the concentration of the impurities therein is plotted as a function of distance $x$ in the perpendicular direction from the crystal face of an epitaxial layer toward a substrate, may be either convexed as in FIG. 7(*a*) or concaved as in FIG. 7(*b*) depending upon the fabrication techniques to be described with connection to the succeedingly introduced embodiments of the present invention. The convex profile of FIG. 7(*a*) may be exhibited when the impurities are introduced by a technique such as ion implantation, whereas the concave profile of FIG. 7(*b*) may be indicated when impurity distributions, extending from above and below an epitaxial layer overlap each other to form a common area.

Based upon these considerations, the present invention proposes its first integrated-circuit isolation technique, in which both base regions and isolation regions are fabricated simultaneously by one and the same impurity introduction step, in such a manner that the impurities so introduced exhibit the same concentration profile in the both regions in the direction perpendicular to the crystal face, thereby to provide an integrated circuit of high performance and with a high degree of integration. The concrete steps involved in this isolation technique are described in the following with relation to the fabrication of the $n^+pn^-n^+$ lateral transistor of the invention shown in FIG. 8, in which is utilized the aforesaid ion implantation technique.

This fabrication process starts with the selective diffusion of $n^+$-type impurities into part of a *p*-type substrate 1 to form a region 10 as in FIG. 8(*a*). This $n^+$-type region 10 is then buried beneath an $n^-$-type epitaxial layer 5 as in FIG. 8(*b*). Succeedingly, by one and the same photoetching process, a desired pattern of windows is opened in a diffusion mask 4( of silicon diodixe, for example) and a vacuum evaporated mask 11 (of molybdenum, for example) which can be used for ion implentation as well as for impurity diffusion at high temperatures, as in FIGS. 8(*c*) and (*d*). A base region 3 and isolation regions 12 are formed succeedingly as in FIG. 8(*e*) by the process of ion implantation together with the ensuing heat treatment, if necessary. The impurity profile at this moment will be represented by the curve of FIG. 7(*a*) having its peak at a point slightly inside of the crystal face of the epitaxial layer 5 due to the ion implantation characteristics. In the following FIG. 8(*f*), additional windows are etched open through the masks 4 and 11 besides the existing windows in order to form those lateral-transistor portions which are to become $n^+$-type collector regions. Then, as in FIG. 8(*g*), a doped oxide 13 which permits the diffusion of $n^+$-type impurities therethrough is overlaid upon the entire exposed surface at low temperatures. This overlaid doped oxide layer 13 is subjected to the same photoetching process as above and is succeedingly heat treated at high temperatures, in such a manner that $n^+$-type impruities are diffused therethrough to form only $n^+$-type collector region 7 and $n^+$-type emitter region 14, as in FIG. 8(*h*).

It will now be clear that the foregoing steps ensure the isolation of the lateral transistors of the $n^+pn^-n^+$ configuration in an integrated circuit simultenaously with the introduction of the base impurities. According to this lateral transistor configuration, the base region 3 is isolated from the *p*-type substrate by means of the $n^+$-type buried layer and, moreover, is reduced in resistivity since it is of *p*-type containing the peak concentration of the impurities as a result of the ion implantation process. In other words, this reduction of the base resistance is due to the fact that the peak of the convexed impurity profile of FIG. 7(*a*) as a result of the ion implantation process is located in the base region 3. As may be seen from the impurity profile, an active base portion in which the minority-carrier injection from the emitter region 14 mostly takes place is located closer to the upper face of the epitaxial layer, so that the base width of this integrated lateral transistor may be defined by a difference between the lengths of the base ion implatation and the emitter diffusion and is hence controllable on the order of several tenths of one micron. It is accordingly possible to accomplish the dual objective, hitherto considered self-contradictory and therefore almost unattainable in the transistors of prior design, of reducing both the base width and the base resistance of the lateral transistor in an integrated circuit. As a result, the base of the transistor in the direction perpendicular to the crystal face thereof does not have the depletion region extended not so much as in the transistors of prior design, so that the epitaxial layer 5 upon the $n^+$-type buried layer 10 can be considerably reduced in thickness. This feature of the lateral transistor of the invention also serves for the simultaneous introduction of the impurities into the base and isolation regions. The collector depletion region extends through the laterally disposed $n^+$-type epitaxial layer 5 adjacent the $n^+$-type collector region 7, so that the base width of the lateral transistor is hardly affected thereby and is free from the basewidth modulation effect or punch-through even through the base width may be less than one micron.

A second isolation technique in accordance with the present invention for the fabrication of an integrated $n^+pn^-n^+$ lateral transistor of analogous characteristics, in which the steps of diffusion and epitaxial growth are utilized without use of the ion implantation technique, will now be described with reference to FIG. 9.

Figure 9A:
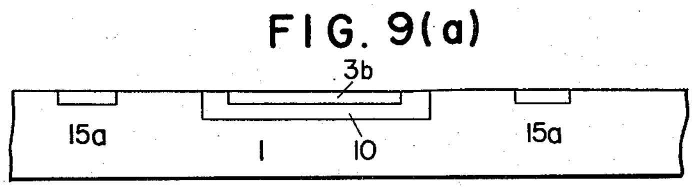
FIGS. 9(*a*) through (*c*) are schematic diagrams showing in sequence the steps of fabrication of an integrated lateral transistor in accordance with the present invention, in which the base and isolation regions are formed by the technique of impurity diffusion effected from above and below an epitaxial layer.
Figure 9B:
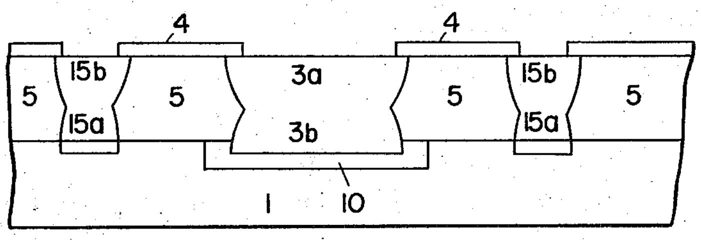
Figure 9C:
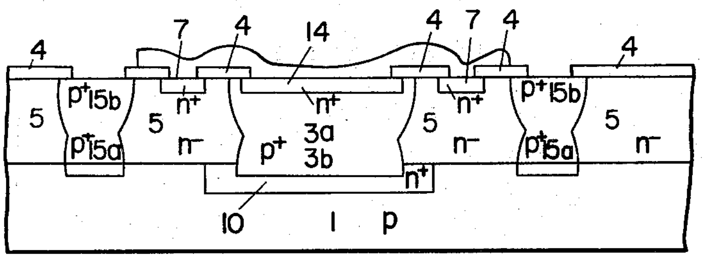
Figure 8A:
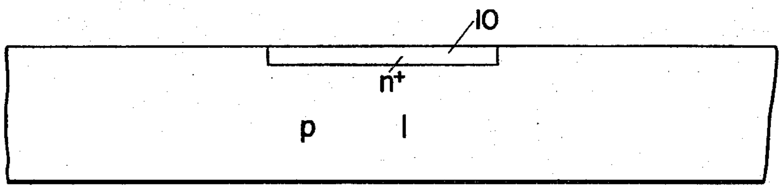
FIGS. 8(*a*) through (*h*) are schematic diagrams showing in sequence the steps of fabrication of an integrated lateral transistor in accordance with the present invention, in which the base and isolation regions are formed by the ion implantation technique.
Figure 8B:
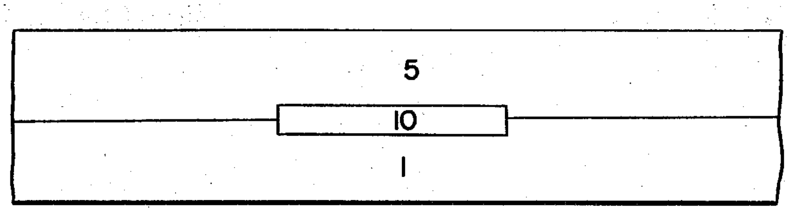
Figure 8C:
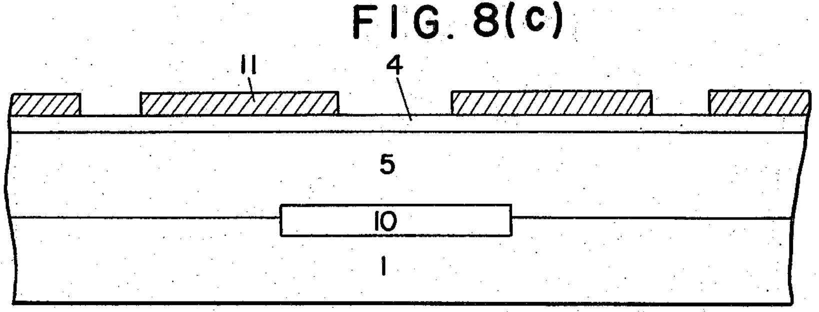
Figure 8D:
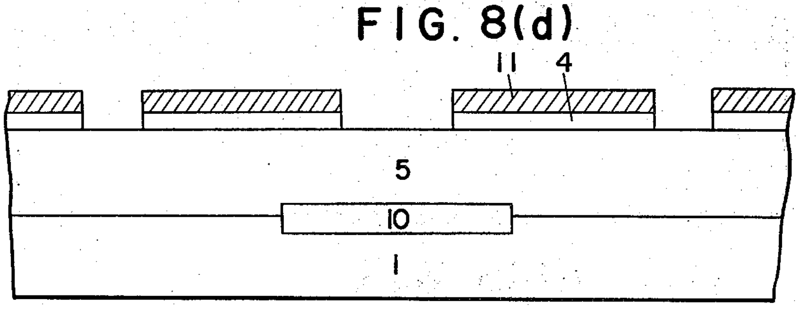
Figure 8E:
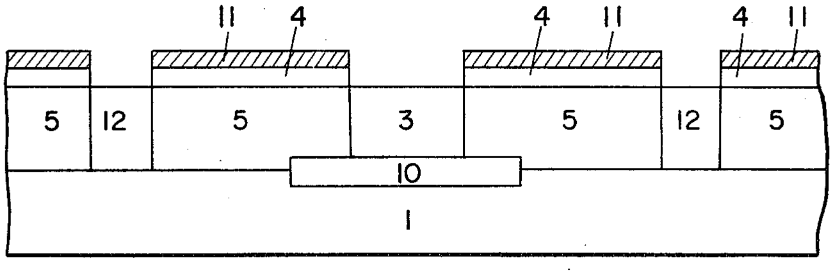
Figure 8F:
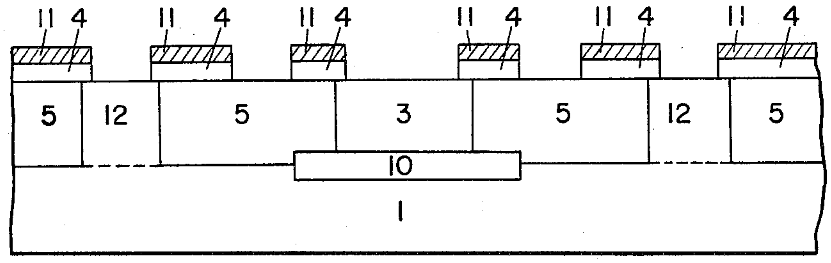
Figure 8G:
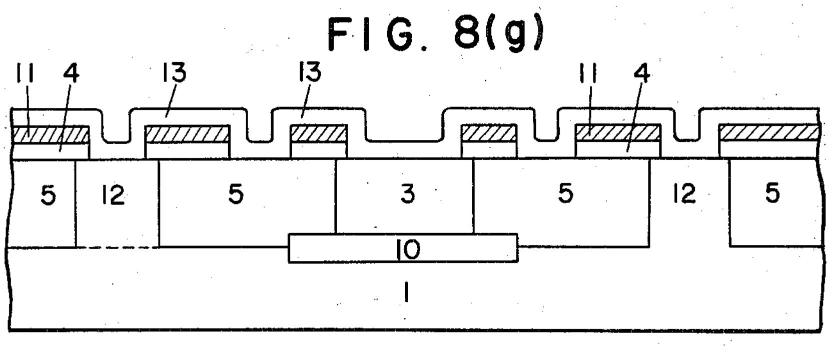
Figure 8H:
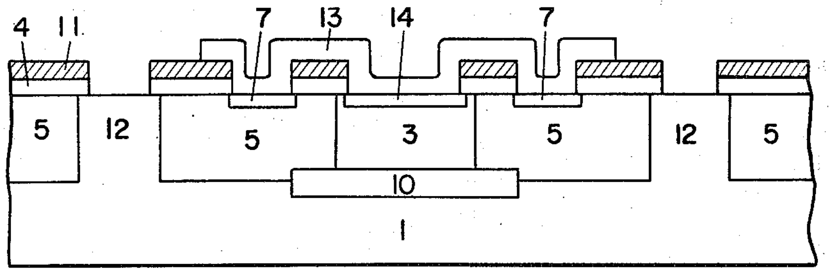

First, as in FIG. 9(*a*), an $n^+$-type region 10 is formed in a *p*-type substrate 1 by selective diffusion, followed by that of $p^+$-type layers 3b and 15a (the latter being for isolation purposes). An $n^-$-type epitaxial layer 5 is then grown as in FIG. 9(*b*), thereby to bury the aforesaid layers **3*b* and 15*a*; thereafter, the simultaneous diffusion fabrication of parts of isolation regions 15*a* and 15*b* and a base region 3a is carried out selectively through etched windows of a mask 4 deposited upon the epitaxial layer 5. Subsequently, in order to form an $n^+$-type collector region 7 as in FIG.9(c), a desired pattern of windows is opened in the mask 4 by the photoetching technique, in such a manner that the previously opened base diffusion windows, etc., are left unmodified. A doped oxide containing $n^+$-type impurities is deposited at low temperatures over the entire mask surface and, after a further photoetching process (which may be slightly lacking in accuracy) thereby to prevent the isolation regions 15*a* and 15*b*, etc. from being diffused with the impurities, the $n^+$-type impurities are diffused to form only an $n^+$-type emitter region 14 and $n^+$-type collector region 7, as in FIG. 9**(*c*).

According to this second isolation technique for the $n^+pn^-n^+$ lateral transistors in an integrated circuit, the impurity distributions in the base region 3 and the isolation region 15 (which are to be considered only for those impurities which determine the conductivity type of the base region 3) are substantially the same, exhibiting the concaved profile of FIG. 7(*b*), for example. And the base resistance in this case is reduced because of the presence of the $p^+$-type buried layer **3*b*, whereas the width of the active base portion (as measured in the direction in parallel with the face of the epitaxial layer 5) in which minority-carrier injection from the emitter region 14 mostly takes place, is reduced to less than 1 micron as this base width is determined by a differene between the lengths of the base diffusion and the emitter diffusion. Hence, as in the foregoing example described with reference to FIG. 8**, this second isolation technique makes possible the reduction of both the base width and the base resistance together with the isolation of the lateral transistors in an integrated circuit.

Thanks to the foregoing two isolation techniques in accordance with the present invention described with reference to FIGS. 8 and 9, respectively, the base and isolation regions can be fabricated at the same time by the process of ion implantation or diffusion through the mask windows that need no re-arrangment, and the depth of the epitaxial layer is reduced approximately to the same depth as that of the base impurity introduction. With all these features of the isolation techniques combined, the isolated lateral transistors of the invention are formed in an extremely compacted state for the provision of the integrated circuits of high performance.

There is described below a third isolation technique in accordance with the present invention, in which the lateral transistors of FIGS. 3 and 4 are isolated in integrated circuits having substrates of high resistivity. This third isolation technique requires a fewer number of steps than the foregoing two techniques and brings a number of advantages to the fabrication of integrated lateral-transistor circuits and to the performance of the circuits so fabricated. According to this third technique, too, however, the base width is defined by a difference between the lengths of base ion implantation or diffusion and emitter diffusion, the base resistance is sufficiently reduced, and the lateral transistors of the invention described already are adapted. The only noticeable difference thereof from the first and second isolation techniques is that these lateral transistors are isolated with the use of wafers having a $\pi$ - or $\nu$ -type substrate. Defined more clearly, a substrate having high resistivity compared with a *p*- or *n*-type base region formed by the impurities of the respective conductivity type introduced therein is termed a $\pi$ - or $\nu$-type substrate, respectively.

More specifically, the third isolation technique in accordance with the present invention has to do with an integrated circuit in which the base regions (defined by the impurities introduced by the ion implantation technique which may include a process of diffusion) of a plurality of the lateral transistors incorporated are commonly in contact with a $\pi$- or $\nu$-type substrate. Three examples of the isolation technique, in which the transistors are isolated by means of $\pi$-type substrates by way of example, are given hereinbelow.

Figure 10A:
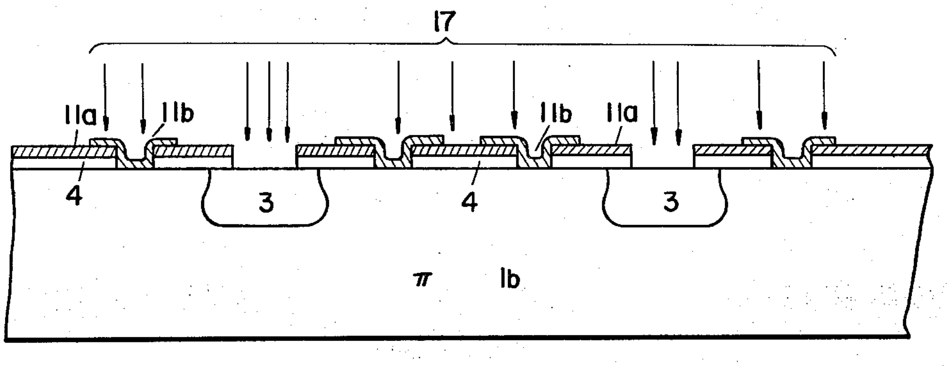
FIGS. 10(*a*) and (*b*) are schematic diagrams showing in sequence the steps of fabrication of integrated lateral transistors by the ion implantation technique in accordance with the present invention, the isolation of the lateral transistors here being accomplished with the use of $\pi$-type substrate having higher resistivity than the base regions of the transistors.
Figure 10B:
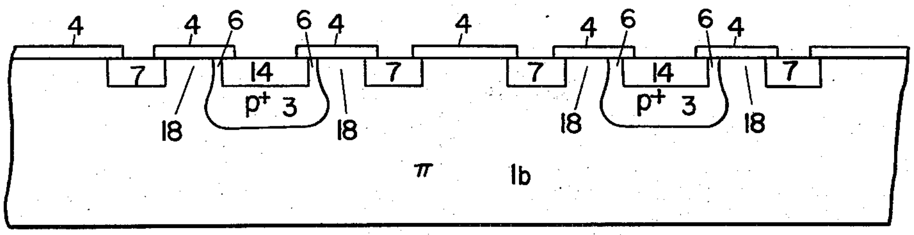

In the first of the three examples, illustrated in FIG. 10, two lateral transistors in accordance with the present invention are isolated by a $\pi$-type substrate. Referring more particularly to FIG. 10(a), the reference character 1b indicates a $\pi$-type substrate (the substrate in use is assumed to be of $\pi$ type when *p*-type base regions are to be formed therein, and of $\nu$-type when n-type base regions are to be formed). A desired pattern of windows for the formation of collector regions in addition to those for the formation of base and emitter regions is etched through a mask 4 of silicon dioxide and another mask 11*a* of metallic material which is vacuum evaporated upon the first mentioned mask 4 for the implantation of ions into portions 3 of the substrate 1*b* which are to define the base regions of the lateral transistors. The ion beam for the ion implantation process is indicated by 17. Enumerated below by way of example are the primary steps involved in the fabrication of the integrated circuits, comprising two or more lateral transistors as in FIG. 10, according to the third isolation technique of the invention:

1. Opening of windows through the masks 4 and 11a by the photoetching technique for the formation of emitter (as well as base) and collector regions;
2. Shielding of the collector regions by means of a vacuum evaporated metallic film 11*b*, for example;
3. Ion implantation into the base regions 3;
4. Removal of the aforesaid vacuum evaporated metallic film 11*b*, thereby to expose the previously opened windows above the collector regions;
5. Diffusion of n-type impurities into both the emitter and collector regions;
6. Opening of windows through bonding pad for providing contacts of the base regions; and
7. Aluminum metalization and interconnection of the integrated circuit components.

FIG. 10(*b*) illustrates a condition of the integrated circuit following the emitter and collector diffusion. In the drawing, 14 indicates emitter regions, 7 indicates collector regions, and 3 indicates high-concentration $p^+$-type base regions subjected to the ion implantation process. The base width of each of the lateral transistors in this integrated circuit, to be measured at the active portion 6 of the base region 3 in the lateral direction, is defined as in the foregoing examples by a difference between the lengths of the p-type base ion implantation and the *n*-type emitter diffusion, so that this base width is obtainable on the order of several tenths of 1 micron. Laterally extending portions 18 of the $\pi$-type substrate (i.e. a highly resistive *p*-type substrate) constitute collector depletion regions which are to be depleted of carriers when the collector and base regions are reverse-biased. Since the locations of the emitter and collector regions of the integrated circuit are determined by a single photoetching operation, the thickness of each of those depletion can be reduced to about one micron or less. Hence the sufficiently narrowed widths of the active base portions and the collector depletion regions, in combination with the substantial absence of collector resistance in the lateral direction, make the integrated lateral transistors of FIG. 10 operable at high frequencies and at extremely high switching speeds, like the other lateral transistors of the invention including those illustrated in FIGS. 3, 4(*a*) and 4(*b*).

One of the most pronounced features of the configuration of the integrated lateral transistors in accordance with the above third isolation technique of the invention may be that their *p*-type base regions are in direct contact with the $\pi$-type substrate. What deserves attention with connection to this feature of the integrated lateral-transistor configuration is the possible leakage resistance from the *p*-type base regions to the $\pi$-type substrate. However, the possibility of leakage current can be determined only in consideration of the resistance $(kT/q)I_E$ of the individual transistor at the time of emitter-to-base forward-biasing, If $kT/q = 25$ mV, this resistance is only 25 $\Omega$ even in case $I_E$ is assumed at 1 *mA*. In contrast, the spreading resistance present between the base region and the $\pi$-type substrate is as much as about 50 k$\omega$if a 100$\mu$ crosssectional length and a 500$\omega$cm specific resistance of $\pi$ are assumed, so that the leakage current to the $\pi$-type substrate may safely be regarded as negligible. However, caution has to be expended in their geometrical arrangement in view of the possible occurrence of slight signal leakage.

Figure 11:
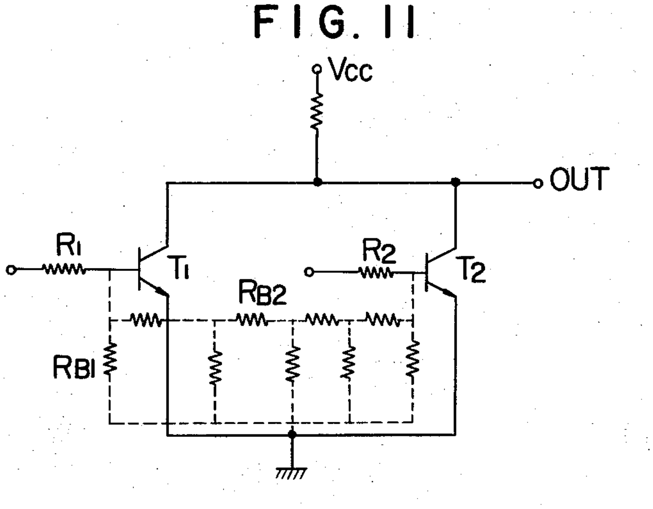
FIG. 11 is an equivalent circuit diagram of an RTL incorporating the lateral transistors of the invention which are isolated with the use of a $\pi$-type substrate.

The equivalent circuit of the above integrated circuit incorporating the lateral transistors of the invention isolated by the $\pi$-type substrate may be represented by an RTL circuit diagram of FIG. 11. In the drawing the real lines indicate the ordinary RTL circuit portion, whereas resistances $R_{B1}$, $R_{B2}$ and so forth are produced in distributed form because the base regions of the transistors are in direct contact with one and the same $\pi$-type substrate. As may be seen from the foregoing considerations, a loss of input current due to leakage causes no serious problem since the aforesaid resistances are sufficiently higher than the emitter forward resistance of the respective lateral transistors, nor does the signal leakage between the transistors pose any difficulty because most of the leaking current will flow into the substrate. Thus, in clear distinction from the prior integrated circuit isolation techniques, the above described technique of the invention with the use of the $\pi$-type substrate does not require any substantial increase in the number of steps involved and can be employed advantageously for the efficient and speedy fabrication of high-performance integrated circuits.

Figure 12A:
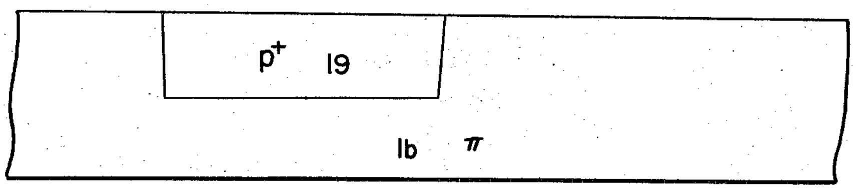
FIGS. 12(*a*) through (*c*) schematic diagrams showing in sequence the steps of fabrication of another lateral transistor in accordance with the present invention, the lateral transistor being formed in a $\pi$-type substrate by the techniques of ion implantation and diffusion with a view to further reduction of the base resistance of the transistor.
Figure 12B:
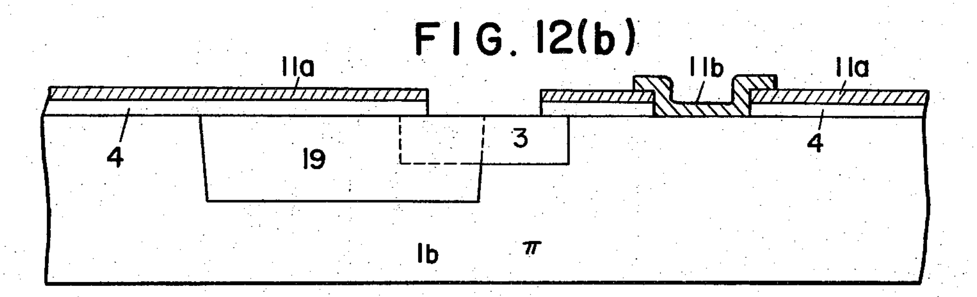
Figure 12C:
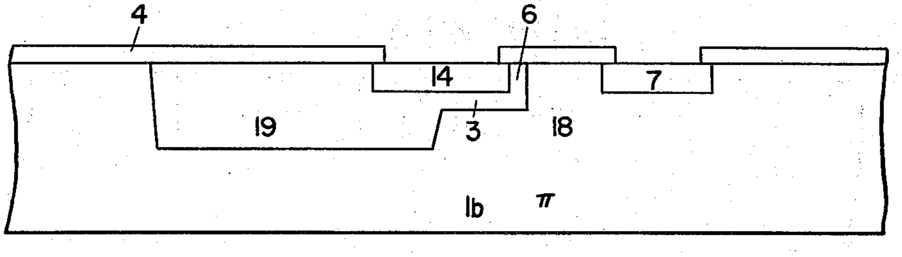

For the purpose of still further reduction of the base resistance of a lateral transistor in accordance with the present invention, there may be contemplated the configuration as illustrated in FIG. 12. In the integrated lateral transistors of FIG. 10, each base region was formed by the ion implantation technique. The base resistance in this case, as described already, can be considerably reduced in the lateral direction if the peak of the convexed distribution curve of the implanted ions, located in the base region, is made as high as to almost bring about a limit of solid solubility. Yet the base resistance may not always be reduced satisfactorily in that manner for practical reasons. Alternatively, this objective can be accomplished in the lateral transistor configuration of FIG. 12. In FIG. 12(*a*) the reference character 1*b* indicates a highly resisting $\pi$-type substrate and 19 indicates the portion of the substrate diffused with $p^+$-type impurities. To describe the fabrication steps of this transistor, which are analogues to those explained with reference to FIG. 10, a mask 4 of a suitable oxide is deposited upon the substrate 1*b* and the exposed surface of the $p^+$-type region 19, and an ion implantation mask 11*a* is further deposited thereupon. Windows are then etched open through the maskes 4 and 11*a* above those portions of the substrate 1*b* which are to become collector and emitter regions, respectively, and one of the windows which is located above the portion to become a collector region is temporarily closed with a metallic film 11*b* by the photoetching technique with an aligning accuracy that does not deviate further than the emitter-to-collector spacing, as in FIG. 12(*b*). In the same drawing the reference numeral 3 indicates a base portion formed through the emitter window by the ion implantation technique and the ensuring heat treatment. Hence the overall base region is constituted of the partially overlapped portions 3 and 19 as in the drawing. This $p^+$-type portion 19 serves for the reduction of the base resistance, and the contact of the base region with a lead may be obtained from some adequate part of the portion 19. FIG. 12(*c*) illustrates a condition in which emitter and collector diffusions are completed following the formation of the base region by the ion implantation technique with or without a diffusion process, the emitter region being indicated by 14 and the collector region by 7. These emitter and collector diffusions are assumed to have been made after removal of the metallic film 11*b* deposited upon the collector region 7 for shielding the same against the ion implantation. An active base portion 6 is defined also by a difference between the lengths of the *p*-type base ion implantation and the *n*-type emitter diffusion.

That the lateral transistor thus fabricated in accordance with the present invention is operable at high frequencies and at high switching speeds will be obvious, for reasons described already with reference to FIG. 10. However, in the above described transistor, the base resistance is reduced still further, and that part of the base portion 19 which surrounds the emitter region 14 has high impurity concentration so that there is hardly any minority-carrier injection into this part from the emitter region 14. Further the emitter minority-carrier injection into the base portion 3 in the vertical direction thereof is also negligible because of similarly high impurity concentration therein. Accordingly the greatest minority-carrier injection from the emitter region 14 will take place at the active base portion 6 of FIG. 12(*c*), with the result that a considerably high current amplification factor is obtainable in the lateral direction of this transistor. As in the lateral transistor of FIG. 10, the base width of this transistor is defined by a difference between the lengths of the emitter and base diffusions conducted through one and the same window of the masks, and a portion 18 of the $\pi$-type substrate constitutes a depletion region instead of a collector resistance portion. Also like the transistor of FIG. 10, the lateral transistor of the previously described configuration can be readily incorporated in an integrated circuit making use of a $\pi$- or $\nu$-type substrate.

Figure 13A:
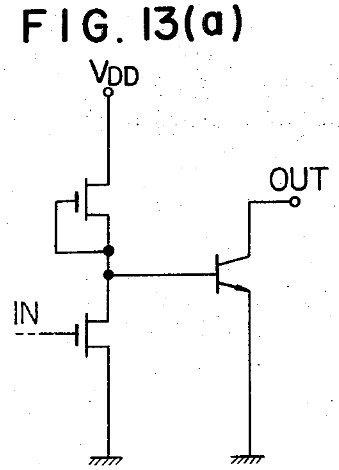
FIGS. 13(*a*) and (*b*) are an equivalent circuit diagram and a schematic diagram, respectively, of an integrated circuit in which a lateral transistor and field-effect transistors are formed on a common $\pi$-type substrate in accordance with the present invention.
Figure 13B:
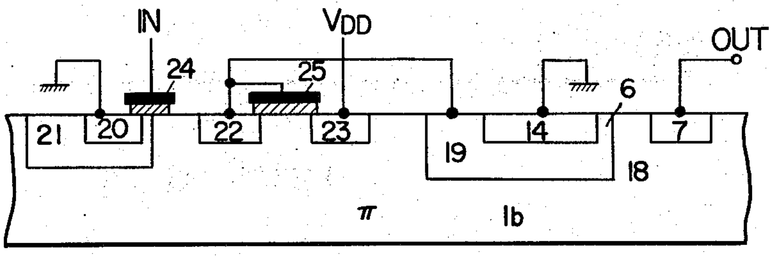

FIG. 13 illustrates a further example of the isolation technique in accordance with the present invention, making use of a $\pi$-type substrate for the fabrication (and isolation) of an integrated circuit incorporating a lateral transistor of the invention in combination with insulated-gate field-effect transistors (hereinafter referred to as IGFETs).

It is well known that an FET exhibits its small-signal, high-speed characteristics to the advantage when working with a small load capacity but may prove to be disadvantageous when put to use with a load of large capacity because of its small transconductance (gm) compared with those of bipolar transistors. Accordingly, for large-scale integration (LSI), a circuit comprising a desired number of FETs may be employed in combination with a bipolar-transistor output circuit for leading the output of the former from the LSI package.

FIG. 13(a) illustrates an example of such configuration, in which the output of a circuit comprising two IGFETs is obtained through a lateral transistor (which of course is bipolar). For the fabrication of an integrated circuit of this type, a greatly involved procedure including the processes of epitaxial growth and isolation diffusion will be necessitated if the bipolar transistor in use is of prior design. According to the present invention, this integrated circuit can also be fabricated easily with the use of a $\pi$-type substrate. An integraced circuit corresponding to the circuit arrangement of FIG. 13(*a*) is illustrated schematically in FIG. 13(*b*). In the drawing, 20 indicates a source region of an IGFET for amplification. A region 21 in which is formed the channel of the same IGFET is referred to as a "base region" thereof for convenience sake throughout the rest of this specification. A region 22 serves as both a drain of the IGFET for amplification and a source of another IGFET for load. The latter IGFET for load has its drain region at 23. 24 indicates the gate of the IGFET for amplification and 25 indicates the gate of the IGFET for load. These IGFETs and the lateral transistor comprising regions 7, 14, 18 and 19 have their base regions 21 and 19 in direct contact with a common substrate 1*b*, which is of $\pi$ type in case both the base regions are of *p* type. By this configuration is it possible to advantageously integrate the IGFETs and lateral transistor in a single circuit without need for the complex process of epitaxial growth or isolation diffusion.

Although the present invention has been shown and described in the foregoing according to some specific embodiments thereof, it is to be understood that the invention is not to be restricted thereby but includes obvious and reasonable equivalents within its scope defined only by the appended claims.

We claim:

1. In an integrated circuit, at least one lateral transistor comprising a substrate having a main surface, a base region in said substrate defined by impurities of one conductivity type distributed by means of ion-implantation in such manner that their peak concentration is at a selected depth from the main surface of said substrate, an emitter region defined in said base region by impurities of another conductivity type, the main active base width of said base region being defined by a difference between the lengths of the diffusion of said impurities of one conductivity type and the diffusion of said impurities of another conductivity type, the base impurity concentration near an emitter junction being substantially higher in a portion under said emitter region than in an active base region beside the lateral part of said emitter region, said base region being in direct contact with a portion of the substrate having a higher resistivity of the same conductivity type as said base region, and a collector region defined in said substrate by impurities of the same conductivity type as said emitter region being disposed laterally of said base region and being separated from said base region by a portion of said substrate forming a collector depletion region.

2. An integrated circuit according to claim 1, in which said substrate is $\pi$-type, the base region is p-type and the emitter and collector regions are *n*-type.

3. An integrated circuit according to claim 1, comprising a plurality of lateral transistors whose base regions are of one and the same conductivity type and in direct contact with a common substrate having higher resistivity of the same conductivity type as said base regions, said lateral transistors being isolated from one another by said high resistivity substrate, said transistors having collector junctions in direct contact with said high resistivity substrate having the same conductivity type as said base regions.

4. In an integrated circuit as claimed in claim 1, a plurality of field-effect transistors, comprising a substrate, base regions of said lateral transistor and of said field-effect transistors being of one and the same conductivity type and being disposed in direct contact with the substrate, said substrate having the same conductivity type as said base portions of said lateral transistor and said field-effect transistors, said substrate having a higher resistivity than the last-mentioned base portions, and said lateral transistor having a collector junction and said field effect transistors having drain junctions in direct contact with said high resistance substrate having the same conductivity type as said base regions.

5. An integrated circuit according to claim 4, in which said substrate is $\pi$-type.

6. In an integrated circuit, at least one lateral transistor comprising a substrate, an epitaxial layer overlying said substrate, a base region partly in said substrate and partly in said epitaxial layer and defined by impurities of one conductivity type distributed by means of ion-implantation in such manner that their peak concentration is at a selected depth from the surface of said epitaxial layer, an emitter region defined in said base region by the diffusion therein of impurities of another conductivity type, the main active base width being defined by a difference between the lengths of the diffusion of said impurities of one conductivity type and the diffusion of impurities of said other conductivity type, the base impurity concentration near an emitter junction being substantially higher in a portion under said emitter region than in an active base region beside the lateral part of said emitter region, a collector region of the same conductivity type as said emitter region disposed laterally of said emitter region, a buried layer underlying said base region and having a high impurity concentration and the same conductivity type as said collector region, a portion of said base region which underlies said emitter region and which is high in base impurity concentration and low in resistivity being isolated from the substrate by said buried layer, said substrate having the same conductivity type as said base region.

7. An integrated circuit according to claim 6, in which said impurities of one conductivity type implanted and diffused into said epitaxial layer so as to define the base region and in isolation regions of said at least one lateral transistor have substantially the same impurity distribution in said base region and said isolation regions in a direction perpendicular to said epitaxial layer.

* * * * *